(12) United States Patent
Motta et al.

(10) Patent No.: US 8,228,216 B2
(45) Date of Patent: Jul. 24, 2012

(54) SYSTEMS AND METHODS FOR DATA COMPRESSION

(75) Inventors: Giovanni Motta, San Diego, CA (US);
Marko Slyz, San Diego, CA (US);
Lashawn McGhee, Murrieta, CA (US);
Sait Can Saydag, San Diego, CA (US);
Brian O'Neill, San Juan Capistrano, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 128 days.

(21) Appl. No.: 12/877,673

(22) Filed: Sep. 8, 2010

(65) Prior Publication Data
US 2012/0056763 A1 Mar. 8, 2012

(51) Int. Cl.
*H03M 7/30* (2006.01)
(52) U.S. Cl. ............ 341/87; 341/50; 341/51; 382/232; 382/235; 382/240; 382/246; 382/305
(58) Field of Classification Search .......... 341/50, 341/51, 87; 382/170, 240, 232, 235, 246, 382/305
See application file for complete search history.

(56) References Cited

U.S. PATENT DOCUMENTS

| | | | | |
|---|---|---|---|---|
| 3,656,178 A | * | 4/1972 | De Maine et al. | 341/87 |
| 5,109,433 A | * | 4/1992 | Notenboom | 382/240 |
| 5,537,551 A | | 7/1996 | Denenberg et al. | |
| 5,646,617 A | | 7/1997 | Ohmoto et al. | |
| 6,259,093 B1 | * | 7/2001 | Wakiyama et al. | 850/2 |
| 6,463,111 B1 | * | 10/2002 | Upp | 375/372 |
| 6,502,064 B1 | * | 12/2002 | Miyahira et al. | 704/7 |
| 6,925,467 B2 | * | 8/2005 | Gu et al. | 707/687 |
| 7,210,010 B2 | * | 4/2007 | Ogle | 711/162 |
| 7,231,558 B2 | * | 6/2007 | Gentieu et al. | 714/704 |
| 7,348,482 B2 | * | 3/2008 | Ishii et al. | 84/616 |
| 7,487,169 B2 | | 2/2009 | Agarwal | |
| 7,492,953 B2 | * | 2/2009 | Anderson et al. | 382/235 |
| 7,640,354 B2 | | 12/2009 | Bjorner et al. | |
| 8,055,096 B2 | * | 11/2011 | Dahms et al. | 382/282 |
| 2003/0009595 A1 | | 1/2003 | Collins | |

(Continued)

FOREIGN PATENT DOCUMENTS
WO WO 2009/098315 A1 8/2009

OTHER PUBLICATIONS

Yury Lifshits, et al., "Speeding up HMM Decoding and Training by Exploiting Sequence Repetitions", Jan. 2007, pp. 1-16.

(Continued)

*Primary Examiner* — Linh Nguyen

(57) ABSTRACT

In one embodiment, an initial series of bytes are scanned to determine a frequency of occurrence within the initial series of bytes for a plurality of byte strings. A data structure is generated containing the plurality of byte strings and count values representing a frequency of occurrence for the plurality of byte strings in the initial series of bytes. A most common byte string of the plurality of byte strings in the initial series of bytes is determined from the count values. Each instance of the most common byte string in the initial series of bytes is replaced with a first substitute byte string to form a revised series of bytes. A most common byte string in the revised series of bytes is determined from the data structure without resetting the count values associated with at least some of the plurality of byte strings.

14 Claims, 5 Drawing Sheets

U.S. PATENT DOCUMENTS

2004/0162076 A1 8/2004 Chowdry et al.
2011/0135039 A1* 6/2011 Limberg ...................... 375/340

OTHER PUBLICATIONS

Danny Hermelin, et al., "Unified Compression-Based Acceleration of Edit-Distance Computation", Apr. 2010, pp. 1-11.

A. Renyi, "On Measures of Information and Entropy", Proceedings of the 4$^{th}$ Berkeley Symposium on Mathematics, Statistics and Probability, 1960, pp. 547-561.

A Measure of Similarity Between Files, Jun. 2009 from http://en.Wikipedia.org/wiki/Kullback-Leibler_divergence, 4 pages.

Ryozo Kiyohara, et al., "A New Method of Fast Compression of Program Code for OTA Updates in Consumer Devices", IEEE Transactions on Consumer Electronics, vol. 55, No. 2, May 2009, pp. 812-817.

Ryozo Kiyohara, et al., "Method for Fast Compression of Program Codes for Remote Updates in Embedded Systems", SAC, Mar. 2009, pp. 1683-1684.

R.C. Agarwam et al., "An Approximation to the Greedy Algorithm for Differential Compression", IBM J. Res. & Dev., vol. 50, No. 1, Jan. 2006, pp. 149-166.

C/C++ Users Journal, "A New Algorithm for Data Compression", Dr. Dobb's Portal—The World of Software Development, Feb. 1, 1994, URL:http://www.ddj.com/cpp/184402829, 10 pages.

John Bentley, "Programming Pearls", Addison-Wesley Publishing Company, May 1989, pp. 9 and 164.

Giovanni Motta et al., Notification of Transmittal of the International Search Report and the Written Opinion of the International Searching Authority, or the Declaration, International Application No. PCT/US2010/049132 filed Sep. 16, 2010, Date of Mailing: Sep. 14, 2011, pp. 1-8.

\* cited by examiner

SYSTEMS AND METHODS FOR DATA COMPRESSION

BACKGROUND

Data compression is the process of transforming information from one representation to another, more compact representation from which the original can be recovered. The compression and decompression processes are often referred to as encoding and decoding, respectively. Data compression has applications in the areas of data storage and data transmission. Besides compression savings, other parameters of concern include encoding and decoding speeds and workspace requirements, the ability to access and decode partial files, and error generation and propagation.

DETAILED DESCRIPTION

Figure 1:
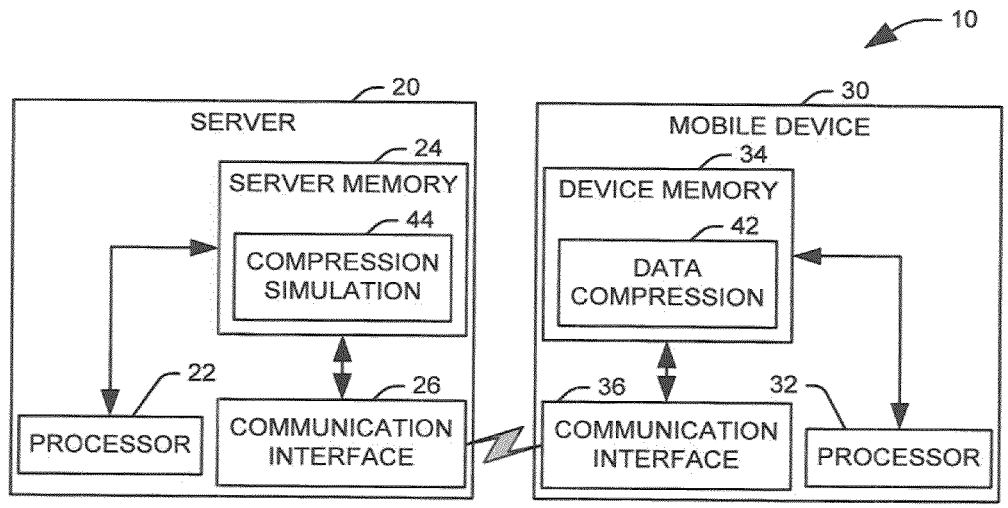
FIG. 1 illustrates an example embodiment of a mobile communications system that can implement an embodiment of data compression.

FIG. 1 illustrates an example of a mobile communications system 10. The system 10 includes at least one server 20, comprising at least a processor 22 and a server memory 24 and configured to communicate, via a communication interface 26, with at least one mobile device 30. It will be appreciated that the communication interface can comprise any appropriate means for passing information between the server 20 and the mobile device 30. In one example implementation, the communication interface 26 can comprise a wireless transceiver. The server memory 24 can include any appropriate standard storage devices associated with computer systems, such as one or more of semiconductor memory, magnetic and optical storage media.

The mobile device 30 includes a processor 32, a device memory 34, and a communication interface 36. The device memory 34 can include any appropriate non-volatile storage media, and, in one example, can be implemented, at least in part, as a flash memory. The communications interface 36 can include any appropriate means for communicating with the server 20. As one example, the communications interface 36 can include a radio frequency (RF) wireless transceiver. The device memory can include a data compression component 42 configured to perform data compression tasks on blocks of data within the device memory 34. For example, the data compression component 42 can include a set of stored executable instructions in the device memory 34 for performing one or more data compression tasks.

An example of a data compression algorithm is byte pair encoding, which compresses a data file by iteratively replacing a frequently occurring pair of adjacent symbols with a substitution byte string, selected as an unused byte, an unused byte string, or a meta-symbol such as a symbol from an extended alphabet. At each pass, the byte pair encoding process finds the most common byte pair, that is, the pair of symbols that occurs more frequently in the data file, replaces the most common byte pair with the substitution byte, and adds the substitution to a table of substitutions. The iterations usually stop as soon as no further compression is possible by this method. A decoder (e.g., on the mobile device 30) can reconstruct the original data file by expanding each substitution byte into its corresponding byte pair with the help of the table of substitutions.

By way of example, the data compression component 42 can be used to limit memory usage during updates on a device storing compressed data. For instance, data can be stored in one type of memory in the device memory 34, such as a flash memory, and decompressed into a second type of memory (e.g., a working memory such as random access memory (RAM)) when needed. Once an update package is received from the server 20, the stored data is decompressed, updated with the update package, and recompressed on the device. This update process often times can be time consuming, and in many mobile devices, the functions of the mobile device are made unavailable to the users during updates.

In the illustrated example, the data compression component 42 is configured to efficiently conduct the recompression of the stored data after the update, significantly reducing the time taken by the update process. In one example, the data compression component 42 can comprise a compression algorithm using byte string replacement that is configured to reduce the time necessary for generating a table of substitutions for the compression. For example, when the series of bytes is scanned to provide a count of each of the byte strings within the series of bytes, the count values can be stored in a data structure. The data compression component 42 can be configured such that the individual count values in the data structure are selectively reset during a new scan or updated incrementally to reflect the results of the new scan. Similarly, the results of a given scan can be reused to limit the number of scans necessary to provide the table of substitutions.

Alternatively or additionally, the data compression component 42 can be configured to perform any of a number of update tasks prior to allowing the mobile device to enter an update state. In one example, the update tasks can include precomputing at least a portion of one or more tables of substitutions for the compression. To facilitate the more efficient compression algorithms, the server memory 24 can include a compression simulation component 44 that analyzes a particular block of data and provides information to the data compression component 42, via the communications link, to facilitate the compression of the updated data.

FIGS. 2-7 illustrate examples of flow charts of methods. It is to be understood and appreciated that the illustrated actions, in other embodiments, may occur in different orders and/or concurrently with other actions. Moreover, not all illustrated features may be required to implement the methods. Further, it will be appreciated that the example methods of FIGS. 2-7 are not mutually exclusive, and that various methods described herein can be used in combination to increase the efficiencies of a data compression process.

Figure 2:
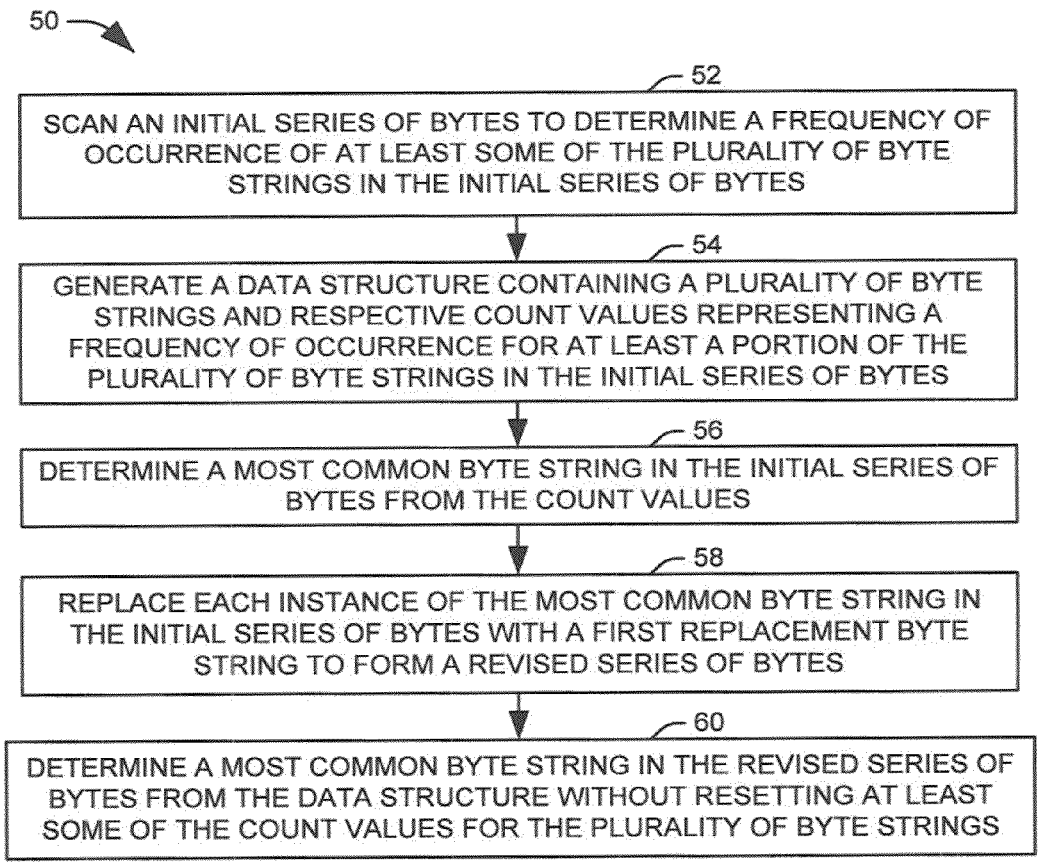
FIG. 2 illustrates an example method for compressing a series of bytes via byte string replacement.

FIG. 2 illustrates an example method 50 for compressing a series of bytes via byte string replacement. At 52, a series of bytes is scanned to determine a frequency of occurrence of each of at least a portion of the byte strings in the series of bytes. For example, the portion of the byte strings can be limited to byte strings of a minimum length (e.g., at least two bytes in length), byte strings of a set length (e.g., byte pairs) or byte strings containing values selected from a standard set of bytes. At 54, a data structure is generated, containing at least a portion of the byte strings and respective occurrence count values representing the frequency with which each byte string occurs in the series of bytes.

At 56, a most common byte string in the series of bytes is determined from the count values in the data structure generated at 54. At 58, the determined most common byte string is replaced with a substitute byte string at each instance of the most common byte string within the series of bytes. The substitute byte string should contain fewer bits than the byte string being replaced, and should be selected to allow a decompressor to unambiguously find the substitute byte strings in the revised series of bytes so that it can perform the reverse substitutions. In some instances, this may require making additional changes in the series of bytes. This series of replacements provides a shorter, revised series of bytes, in which each instance of the most common byte string is replaced with a shorter substitute byte string. At 60, a most common byte string of the revised series of bytes is determined without resetting at least some of the occurrence count values in the data structure generated at 54. For example, the occurrence count values are selectively reset during a scan of the revised series of bytes. In another example, the occurrence count values are incrementally updated during a scan of the revised series of bytes to transition the occurrence count values in the data structure from the results of the initial scan of 52 to the results of the scan of the revised series of bytes. In yet another implementation, the count values stored in the data structure can be reused to determine a most common byte string for the revised series of bytes. Regardless, the method of FIG. 2 allows for the efficiency of the compression of the series of bytes to be significantly increased, particularly when performed at a system having limited computation resources.

Figure 3:
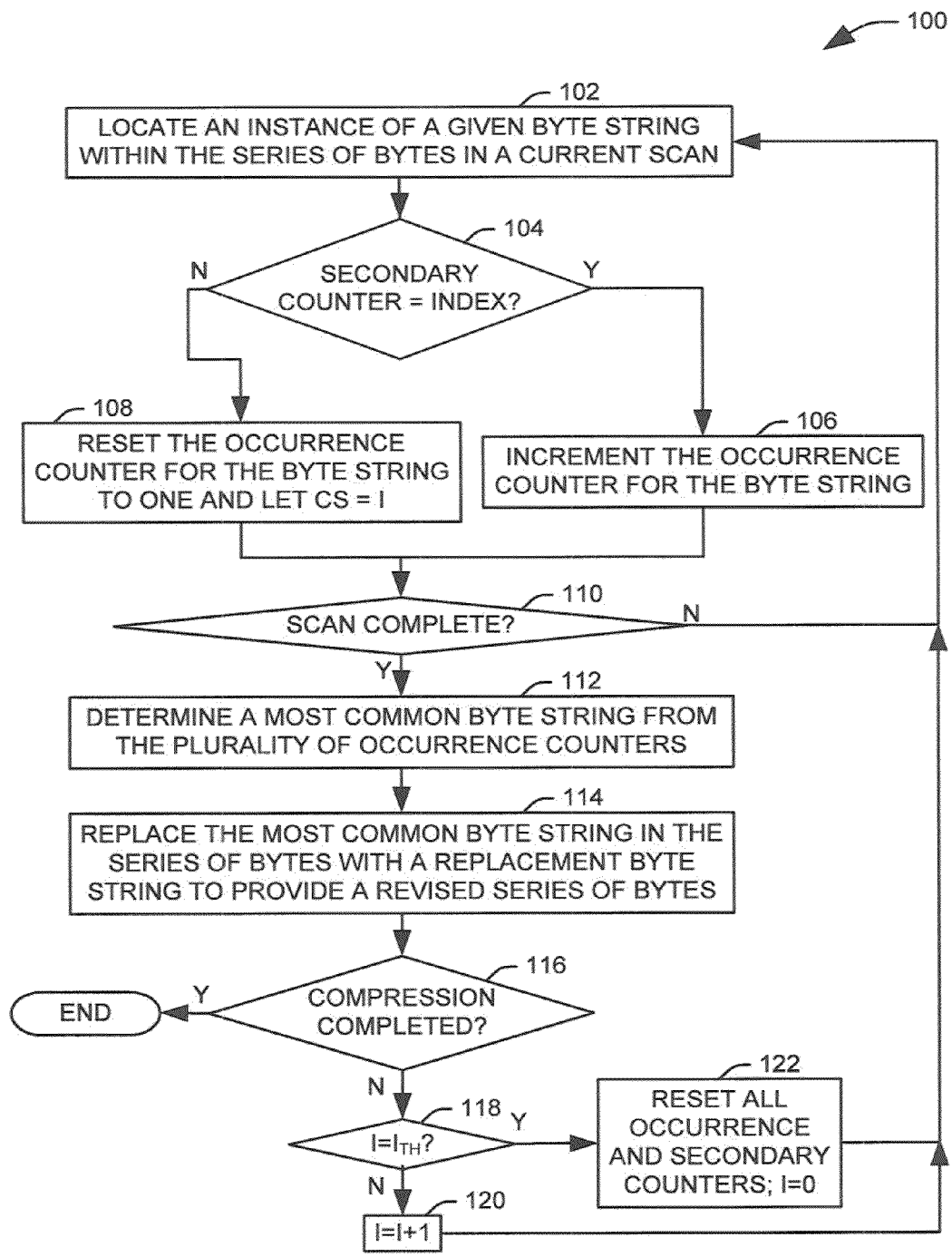
FIG. 3 illustrates another example embodiment of a method for encoding a series of bytes in a data compression task.

FIG. 3 illustrates another example of a method 100 for encoding a series of bytes in a data compression task. In the illustrated method, count values from the scans are stored in a data structure containing an occurrence counter for each of the plurality of indexed byte strings, as well as a second counter for each byte string. For instance, the second counters can be implemented as a set of otherwise unused bits in the bytes that hold the occurrence counters, requiring no additional memory dedicated to the compression task. Each of the occurrence counters and the second counters can be selectively reset, with the second counter serving as a flag for its corresponding occurrence counter that identifies the last scan in which the occurrence counter was reset. Initially, all occurrence and secondary counters are set to zero. At 102, a scan of the series of bytes is begun, and an instance of a byte string is located within the series of bytes. For example, in a byte pair encoding process, this can comprise reading the first two bytes of the revised series of bytes. Other sets of bytes could also be read.

At 104, a value of the second counter, $C_S$, associated with the located byte string is compared to a scan index, I, which is associated with the current scan. The comparison at 104 ensures that the occurrence counter has been updated in the current scan and thus accurately reflects the current count for the byte string. If the second counter is determined to be equal to the index (Y), the occurrence counter for the located byte string is incremented at 106 to reflect the located byte string, and the method advances to 110. Otherwise (N), the method proceeds to 108, where the occurrence counter associated with the located byte string is reset and incremented to reflect the located byte string. Alternatively, at 108, the located byte string can be simply reset directly to a value of one and the second counter associated with the byte string is set to the value of the index to indicate that the occurrence counter has been reset in the current scan. The method then proceeds to 110.

At 110, it is determined if the current scan is complete. For example, the scan can be determined to be complete when an end of the series of bytes is reached. If the scan is not complete (N), the method returns to 102 to locate another byte string within the series of bytes. If the scan is determined to be complete (Y), the method advances to 112. At 112, a most common byte string in the series of bytes is determined from the occurrence count values. At 114, the determined most common byte string is replaced with a substitute byte string (e.g., having a fewer number of bits) at each instance of the most common byte string within the series of bytes to provide a revised series of bytes. At 116, it is determined if the compression is completed. If the compression is complete (Y), the method terminates. Otherwise (N), the method advances to 118.

At 118, it is determined if the scan index has reached a threshold value, $I_{TH}$. The determination at 118 ensures that the scan index does not exceed a capacity of the second counters. For example, if the second counters comprise N bits, the threshold value can be set to $2^N-1$, such that $2^N$ scans can be performed before it is necessary to reset the second counters. As an example, four-bit counters are used and a threshold value of fifteen is set. Thus there are a possible sixteen scans between general reset of the counters. If the threshold value has not been reached (N), the scan index is incremented at 120, and the method returns to 102 to begin a new scan. If the threshold value has been reached (Y), it is determined that the capacity of the second counters has been reached, and the occurrence counters and the second counters in the data structure are reset to default values (e.g., zero). The scan index can also be reset to its default value, which is zero in the illustrated example, and the method returns to 102 to begin a new scan.

Figure 4:
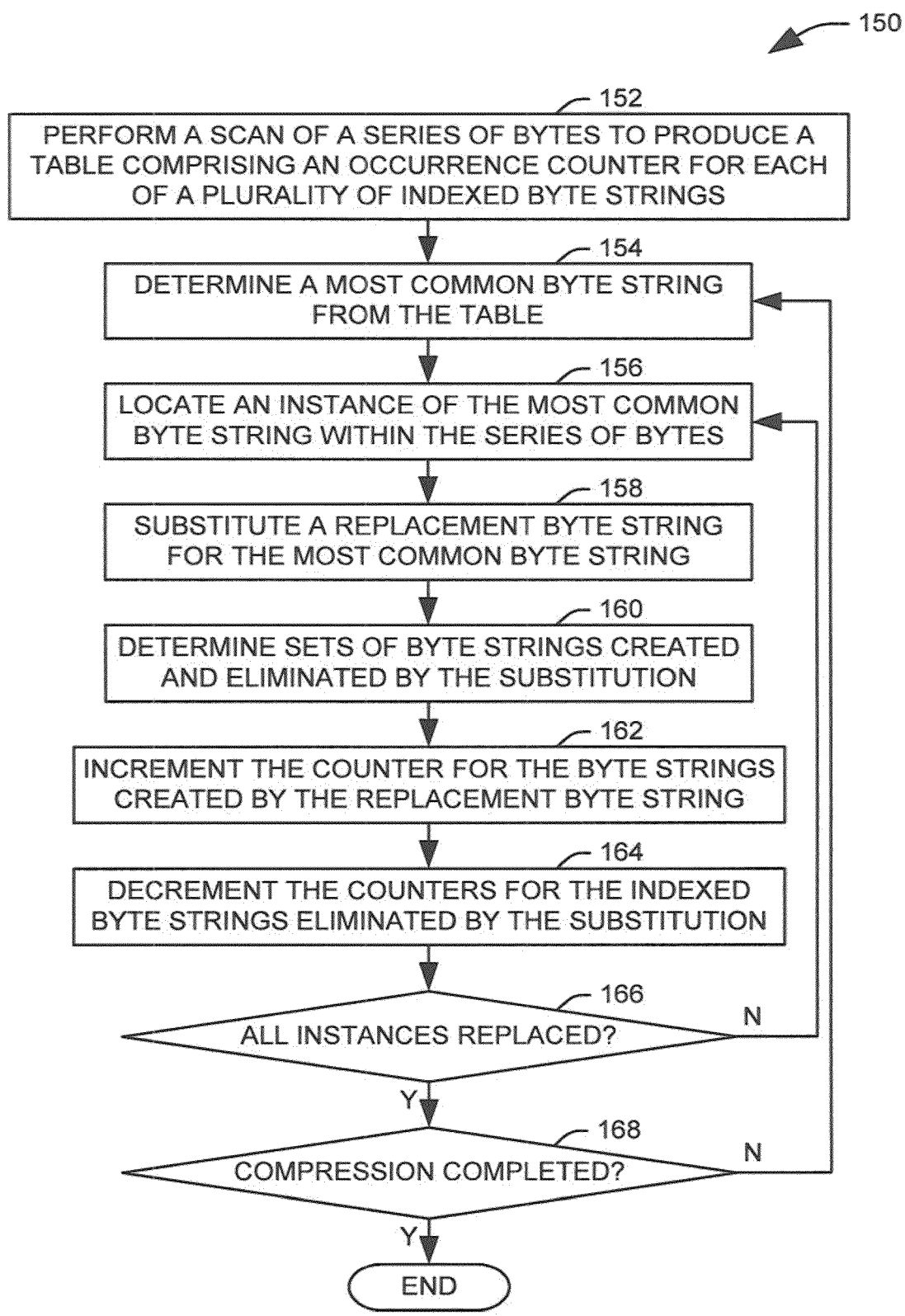
FIG. 4 illustrates another example embodiment of a method for encoding a series of bytes in a data compression task.

FIG. 4 illustrates another example of a method 150 for encoding a series of bytes in a data compression task. The method 150 of FIG. 4 represents an incremental approach to maintaining a counter for the various byte strings of interest, where the results of an initial scan are updated with the replacement of each byte string to obviate any need for resetting the counters created in the initial scan. At 152, the series of bytes is scanned to determine a frequency of occurrence of each of a plurality of the byte strings in the series of bytes that are of interest for indexing in an encoding process. From this scan, a data structure (e.g., a table) is produced containing an occurrence counter for each of the plurality of byte strings. At 154, a most common byte string in the series of bytes is determined from the table. At 156, a first occurrence of the most common byte string within the series of bytes is located, and at 158, the located most common byte string is replaced with a substitute byte string.

At 160, it is determined which of the plurality of byte strings associated with the table have been created or eliminated by the replacement of the most common byte at 158. Accordingly, a first set of byte strings, representing the byte strings eliminated by the replacement, can be determined according to the replaced bytes in the most common byte string and one or more surrounding bytes in the series of bytes.

By way of further example, a byte pair compression process, that is, a byte string replacement compression in which the plurality of byte strings in the table each have a length of two bytes, can be applied to compress a series of bytes "BADCAD" having an alphabet of four individual bytes, A, B, C, and D. As can be seen from the example series, the most common byte pair is "AD". When the first instance of the most common byte string is replaced, with a substitute byte string designated as "X", the revised string becomes "BXCAD". So, it will be appreciated that an instance of the byte pair "AD" has been eliminated, but, in addition, each of an instance of the string "BA" and an instance of the string "DC" have also been eliminated by the substitution. Accordingly, the first set of byte strings, in the example given, would include the strings "AD", "BA", and "DC". Similarly, a second set of byte strings, representing the byte strings created by the replacement, can be determined according to the substitute byte string and one or more surrounding bytes in the series of bytes. Returning to the example above, the replacement of the string "AD" with the replacement string "X" creates two new byte pairs, "BX" and "XC" for the second set of byte pairs.

It will be appreciated, however, that the particular rules for the incremental updating approach depend on the details of the compression method used, and that the determination of which byte strings are affected by a given substitution can be more or less complex than the example above. As one example, adjacent substitutions can cause complications. For instance, if an initial string is ABBBBC, and the substitution is BB=>X, the final string would be AXXC. Thus, in addition to the counters for the bytes at the edge of the substitution region, AX and XC, the counter for XX would also have to be incremented. It will be understood that the process is designed to leave the counters in the same state they would be in after an ordinary left to right scan. Other such rules covering special situations may be used depending on the particular byte pair implementation.

At 162, the occurrence counter associated with each of the newly created byte strings is incremented to reflect the creation of the new byte strings by the replacement of the most common byte string. Generally, the counters associated with the second set of byte strings are each incremented by one. At 164, the occurrence counter associated with each of the eliminated byte strings is decremented to reflect their removal by the replacement of the most common byte string. For instance, the counter associated with each of the first set of byte strings can be decremented by one.

At 166, it is determined if every instance of the most common byte string within the series of bytes has been replaced. If not (N), the method returns to 156 to locate a next instance of the most common byte string within the series of bytes. If every instance has been replaced (Y), the method advances to 168, where it is determined if the compression process has been completed. If not (N), the method returns to 154, where a new most common byte string is determined from the table. Otherwise (Y), if the compression process has been completed, the compression process terminates.

Figure 5:
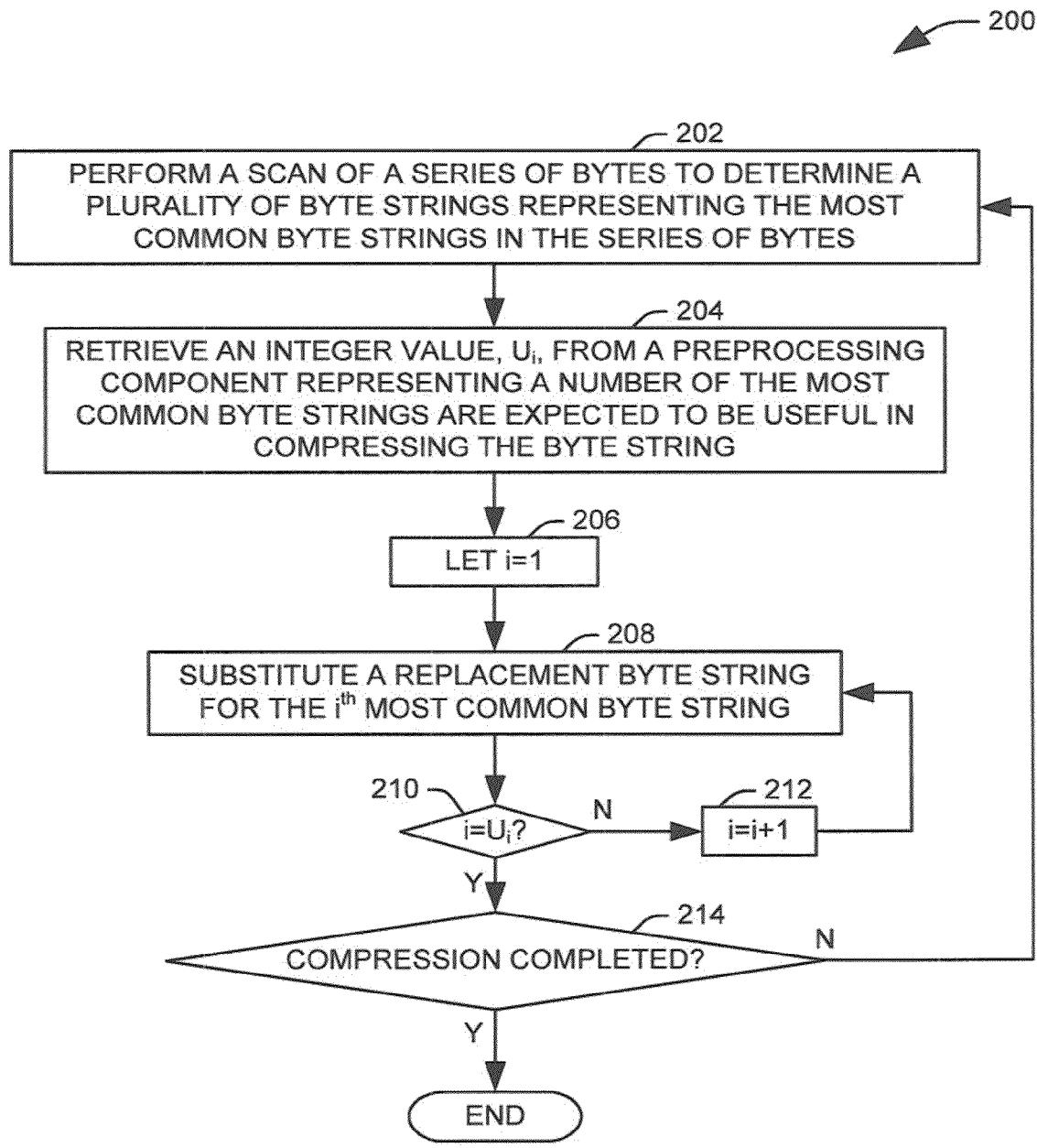
FIG. 5 illustrates another example embodiment of a method for encoding a series of bytes in a data compression task.

FIG. 5 illustrates another example of a method 200 for encoding a series of bytes in a data compression task. The method of FIG. 5 allows for reuse of occurrence count results from a given scan of a series of bytes, such that, for example, both a most common byte string and at least one next most common byte string can be replaced after a given scan. In one example of the described method, a considerable amount of preprocessing can be performed at a remote location, conserving resources at a time or location in which computational resources are limited. For example, the data compression process can take place on a mobile device and a preprocessing component can be located at a remote server associated with the mobile device.

At 202, the series of bytes is scanned to determine a frequency of occurrence of each of a plurality of the byte strings in the series of bytes that are of interest for indexing in an encoding process. From this scan, a table is produced containing an occurrence counter for each of the plurality of indexed byte strings. The counter in the table thus can have a value that identifies each occurrence of the indexed byte strings. At 204, an integer value, represented herein as $U_i$, is retrieved from a preprocessing component. The preprocessing component can be located at a local system in which the data compression task is being performed or at a remote system, with the integer value provided, for example, via an appropriate communications link or via previously received data stored at the local system. The integer value represents, for the scan performed at 202, the number of most common byte strings expected to be useful in compressing the series of bytes. In other words, taking at least a partial ordinal ranking of the indexed byte strings, based on their frequency of occurrence in the scan of 202, the integer value represents how many of the top ranked byte strings would become the most common byte string in a revised byte string produced by a replacement of all preceding byte strings in the partial ordinal ranking.

At 206, a counter, designated as i, is initialized to one. At 208, an $I^{th}$ most common byte string is replaced by a substitute byte string within the current series of bytes to produce a revised series of bytes. At 210, it is determined if the counter is equal to the retrieved integer value ($U_i$). If the counter is not equal to the integer value ($U_i$) (N), the method presumes that a next most common byte string in the partial ordinal ranking represents the most common byte string in the revised series of bytes created at 206. Accordingly, in response to the negative determination at 210, the counter, i, is incremented at 212. From 212, the method returns to 208 to perform another substitution for the $I^{th}$ most common byte string of the partial ordinal ranking. If it is determined at 210 that the counter is equal to the integer value ($U_i$) (Y), either all of the useful results in the partial ordinal ranking have been used or it has been determined that performing a new scan would provide greater efficiency. Thus, in response to a positive determination at 210, and the method advances to 214, where it is determined if the compression process has been completed. If not (N), the method returns to 202, where a new scan is completed to provide a new ordinal ranking for the most common byte strings in the revised series of bytes. Otherwise (Y), the compression process terminates.

Figure 6:
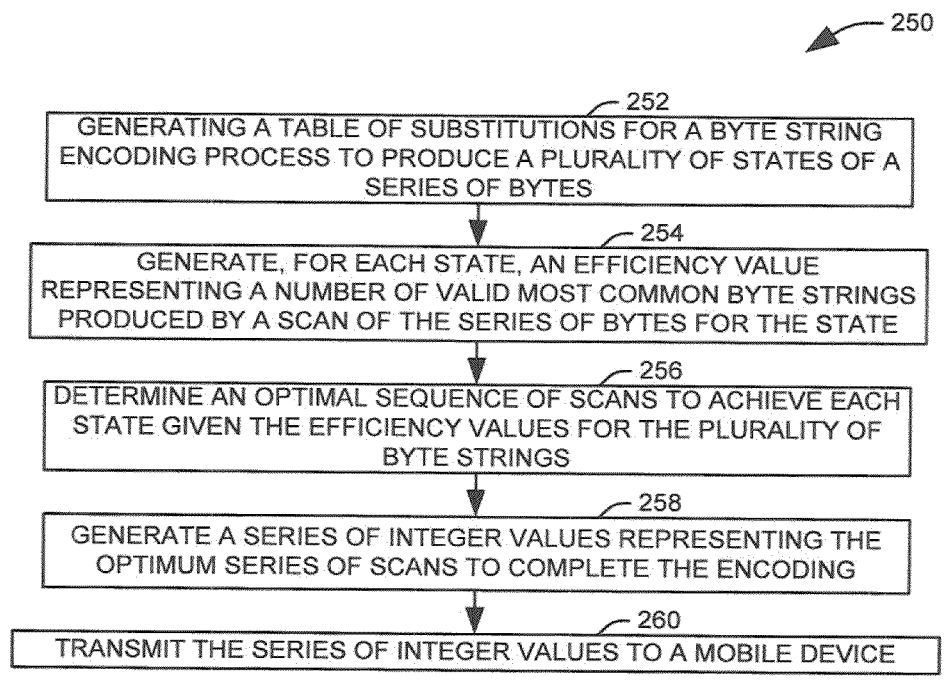
FIG. 6 illustrates an example embodiment of a method for providing a series of integers, each representing a number of results from a partial ordinal ranking that are expected to be useful in an encoding process.

FIG. 6 illustrates an example of a method 250 useable in a preprocessing component for providing a series of integers. For example, the method 250 of FIG. 6 can be used as preprocessing in combination with the method of FIG. 5. Each integer $U_i$ can represent a number of results from a partial ordinal ranking generated by a given scan expected to be useful to provide a maximally efficient compression at a mobile device via byte string substitution. The method of FIG. 6 applies a dynamic programming approach to optimize the compression process, taking into account the utility of each possible scan to determine the shortest possible sequence of scans and a corresponding one or more byte string replacements associated with each scan. It will be appreciated that the number of replacements made for a given scan may not correspond to the maximum available number of most common byte strings in the partial ordinal ranking determined to be valid for reuse in replacements. For example, in the dynamic programming approach, one or more valid results in the partial ordinal ranking from a given scan may be ignored. That is, foregoing one or more valid replacements and rescanning the current string might produce a longer series of byte string replacements than might otherwise be obtained had all valid byte string replacements been performed.

Turning to FIG. 6, the byte string encoding process can include a plurality of successive scans of a series of bytes and at least one replacement of a most common remaining byte string within the series of bytes for each of the successive scans. At 252, a table of substitutions for an encoding process is created, listing at least the most common byte string for each replacement during the plurality of successive scans at a preprocessing component. Each of these replacements represents a corresponding state of the series of bytes created by the replacement and the preceding replacements. In the illustrated method 250, the preprocessing component can be located at a server (e.g., the server 20 of FIG. 1) that provides an update package to a mobile device.

At 254, an efficiency value is generated for each state representing a number of valid replacements that can be made from a scan of the series of bytes in the state. That is, the efficiency value reflects a number of successive replacements that can be made using byte strings taken from the current state of the series of bytes. In practice, the efficiency value designates a number of byte strings at the top of a partial ordinal ranking ordered by frequency within the scanned byte string that represent the most common byte strings of the current state of the series of bytes after all of the most common byte strings above have been used in replacements.

At 256, an optimal sequence of scans is determined for each state from the efficiency values. The optimal sequence of scans represents a minimal set of scans to provide the most common remaining byte string used for the series of replacements that achieve that state. In the dynamic programming method 250, a number of states achievable from the results of each scan can be determined from the efficiency values. From this, a minimal path for the achievable states can be determined. The various sets can be analyzed progressively, such that, the minimal sets associated with previous states can be used to more efficiently determine the minimal set for each new state. For example, if the minimal set for the seventh state is {1,6}, representing scans with the series of bytes in the first and sixth states, with $U_6=3$, then the minimal set for the eighth and ninth states is also {1,6}. Then, if $U_8=4$ and $U_{10}=1$, it may be better to use {1,6,8} as the minimal set for State 10, since that will be valid up through State 11, while {1,6,10} will only be valid up through State 10. This can be continued until a final compressed state of the series of bytes, which represents the minimal set of scans for achieving that state.

At 258, a series of integer values is generated to represent the optimal sequence of scans to complete the encoding process. Each integer value represents a number of valid replacements that can be made for each successive scan. For instance the series of integer values can draw from the top ranked byte strings in a partial ordinal ranking of their frequency in the scanned series of bytes. Accordingly, the series of integer values defines a sequence of scans and a number of ranked substitutions that most efficiently achieves a final state of the series of bytes for each respective scan during the encoding process. The series of integer values can be determined from the minimal set generated for the final state at 256. At 260, the series of integer values is transmitted to the mobile device. For example, the series of integer values can be transmitted by a wireless transmission.

Figure 7:
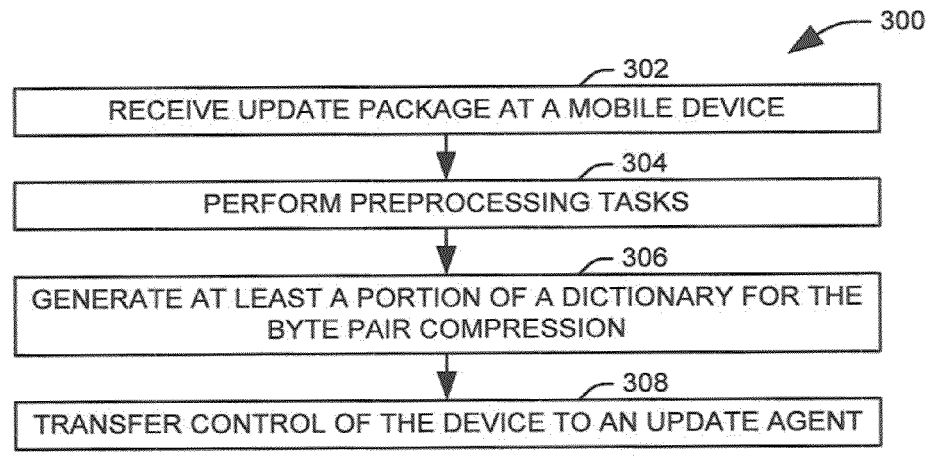
FIG. 7 illustrates another example embodiment of a method for encoding a series of bytes in a data compression task.

FIG. 7 illustrates another example of a method 300 for encoding a series of bytes in a data compression task. In general, performing a software update at a mobile device typically requires re-booting the device in an "update" state before updating the device memory. During the update, the main functions of the device are not available, and in order to use the device, the user has to wait until the update is complete and the device reboots to normal operation mode. The illustrated method 300 uses multitasking to reduce the offline time by pre-computing information necessary to update portions of the memory while the user is making use of the device. For instance, compression and decompression of data on the mobile device is particularly time consuming, and the example method performs at least a portion of the compression task before the update state is initiated. The precomputed data compression information can be stored in non-volatile memory (e.g., FLASH memory) of the mobile device.

At 302, an update package is received at the mobile device (e.g., the mobile device 30 of FIG. 1). For example, the update package can be provided to the mobile device by an associated update server via a wireless transmission. Once a download of the update package is complete, one or more preprocessing tasks are performed at 304. For example, various update operations can be performed in the background prior to entering the update state. Processor and memory usage can be monitored to minimize the impact from preprocessing the updates on the function of the device. At 306, at least a portion of a dictionary for a byte pair compression is generated at the mobile device. For example, the most common pairs and the least common bytes for each of a plurality of stages of a compression process can be computed in the background for one or more data blocks in the device memory before the update state is initiated, greatly reducing the time spent compressing the data block during the update. The data dictionary precomputed at 306 can be stored in memory for use during the update state. At 308, control of the mobile device is transferred to an update agent. The update agent performs the byte pair compression using the at least a portion of the dictionary generated at 306. As a result, the compression can be facilitated.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A non-transitory computer readable medium, storing executable instructions configured to perform, upon execution at an associated processor, a method comprising:
   scanning an initial series of bytes to determine a frequency of occurrence within the initial series of bytes for a plurality of byte strings;
   generating a data structure containing the plurality of byte strings and respective count values representing a frequency of occurrence for the plurality of byte strings in the initial series of bytes;
   determining a most common byte string of the plurality of byte strings in the initial series of bytes from the count values;
   replacing each instance of the most common byte string in the initial series of bytes with a first substitute byte string to form a revised series of bytes; and determining a most common byte string in the revised series of bytes from the data structure without resetting the count values associated with at least some of the plurality of byte strings.

2. The non-transitory computer readable medium of claim 1, wherein determining the most common byte string in the revised series of bytes comprises selectively resetting the count values for the plurality of byte strings during a scan of the revised series of bytes, such that at least one of the count values for the plurality of byte strings is not reset prior to the end of the scan of the revised series of bytes.

3. The non-transitory computer readable medium of claim 1, wherein determining the most common byte string in the revised series of bytes comprises iteratively repeating the following during a scan of the revised series of bytes:
    locating an instance of a given byte string in the revised series of bytes;
    determining if the count value associated with the given byte string has been reset during the scan of the revised series of bytes; and
    resetting the count value associated with the byte string if the count value associated with the given byte string has not been reset during the scan of the revised series of bytes.

4. The non-transitory computer readable medium of claim 3, wherein the count value is a first count value, and generating the data structure comprises generating a second count value for each of the plurality of byte strings, and
    wherein determining if the first count value associated with the byte string has been reset during the scan of the revised series of bytes comprises:
        comparing the second count value associated with the byte string to an index value associated with the scan of the revised series of bytes;
        incrementing the first count value associated with the byte string if the second count value associated with the byte string is equal to the index value; and
        resetting the first count value associated with the byte string to a default value and setting the second count value associated with the byte string to the index value if the second count value associated with the byte string is less than the index value.

5. The non-transitory computer readable medium of claim 1, wherein replacing each instance of the most common byte string comprises editing the count values associated with at least a portion of the plurality of byte strings to reflect the replacement of each instance of the most common byte string, such that once each instance of the most common byte string has been replaced, the count values represent a frequency of occurrence of the plurality of byte strings in the revised series of bytes.

6. The non-transitory computer readable medium of claim 5, wherein editing the count values associated with the at least a portion of the plurality of byte strings comprises:
    determining a first set of the plurality of byte strings representing byte strings eliminated by a replacement of a given instance of the most common byte string;
    determining a second set of the plurality of byte strings representing byte strings created by the replacement;
    decrementing the count value associated with each of the first set of byte strings; and
    incrementing the count value associated with each of the second set of byte strings.

7. The non-transitory computer readable medium of claim 1, wherein determining the most common byte string in the revised series of bytes from the data structure comprises:
    comparing the count values to determine a second most common byte string in the initial series of bytes; and
    using the second most common byte string in the initial series of bytes as the most common byte string in the revised series of bytes.

8. The non-transitory computer readable medium of claim 1, wherein determining the most common byte string in the revised series of bytes from the data structure comprises:
    determining at least a partial ordinal ranking of the plurality of byte strings according to their respective count values, such that at least a second most common byte string in the initial series of bytes is determined;
    receiving an integer value defining a number of top ranked results from the partial ordinal ranking that represent the most common byte string for the revised series of bytes and any subsequent series of bytes, given an expected sequence of substitutions; and
    replacing the determined second most common byte string from the initial series of bytes within the revised series of bytes if the received integer value indicates that the second most common byte string from the initial series of bytes represents the most common byte string in the revised series of bytes.

9. The non-transitory computer readable medium of claim 8, the non-transitory computer readable medium being implemented in a mobile device, and the integer value being generated at an associated server and provided to the mobile device via a wireless transmission.

10. A mobile device, comprising:
    a device memory comprising the non-transitory computer readable medium of claim 1; and
    a processor operatively connected to the memory, such that the executable instructions stored on the computer readable medium of claim 1 are accessed by the processor to perform the method.

11. The mobile device of claim 10, the method further comprising:
    receiving an update package at the mobile device;
    generating at least a portion of a dictionary for a byte pair compression at the mobile device; and
    transferring control of the mobile device to an update agent, the byte pair compression being performed by the update agent.

12. A communications network comprising
    the mobile device of claim 10; and
    a server configured to provide updates to the mobile device via a communications link, the server comprising:
        a server memory storing executable instructions;
        a processor operatively connected to the memory; and
        a communications interface configured to provide the communications link with the mobile device, over which an update is sent to the mobile device.

13. The communications network of claim 12, wherein determining the most common byte string in the revised series of bytes from the data structure occurs at the mobile device and comprises:
    determining at least a partial ordinal ranking of the plurality of byte strings according to their respective count values, such that at least a second most common byte string in the initial series of bytes is determined;
    receiving an integer value defining a number of top ranked results from the partial ordinal ranking that represent the most common byte string for the revised series of bytes and any subsequent series of bytes, given an expected sequence of substitutions; and
    replacing the determined second most common byte string from the initial series of bytes within the revised series of bytes if the received integer value indicates that the second most common byte string from the initial series of bytes represents the most common byte string in the revised series of bytes.

14. The communications network of claim 13, the executable instructions stored in the server memory being configured to perform a second method, comprising:

generating a table of substitutions for a byte string encoding process on the initial series of bytes, the table of substitutions comprising a most common byte string for each of a sequence of states of the series of bytes, a given state in the sequence of states being associated with one of a plurality of byte string replacements and representing the series of bytes after the associated byte string replacement and the byte string replacements associated with all previous states in the sequence;

generating, for each state in the sequence of states, a value representing a number of valid replacements that can be made from the results of a scan of the series of bytes in that respective state;

determining an optimal sequence of scans to achieve each state from the generated values;

generating a series of integer values representing an optimal number of byte string replacements to make after each of a plurality of scans to provide the optimal series of scans; and transmitting the series of integer values to the mobile device, such that the received integer value defining a number of results within the partial ordinal ranking is one of the series of integer values for each respective scan.

* * * * *